(12) United States Patent
Messick et al.

(10) Patent No.: US 11,099,620 B2
(45) Date of Patent: Aug. 24, 2021

(54) FAIL-SAFE POWER LIMIT (FSPL) FOR FAIL-SAFE POWER MANAGEMENT IN INFORMATION HANDLING SYSTEMS

(71) Applicant: Dell Products L.P., Round Rock, TX (US)

(72) Inventors: Douglas E. Messick, Austin, TX (US); Kyle Eric Cross, Austin, TX (US); Dan Rao, Austin, TX (US); Shawn Joel Dube, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 242 days.

(21) Appl. No.: 16/221,242

(22) Filed: Dec. 14, 2018

(65) Prior Publication Data
US 2020/0192451 A1 Jun. 18, 2020

(51) Int. Cl.
| | |
|---|---|
| *G06F 1/28* | (2006.01) |
| *G06F 1/3206* | (2019.01) |
| *G06F 11/07* | (2006.01) |
| *H03K 19/0175* | (2006.01) |
| *H03K 19/00* | (2006.01) |

(52) U.S. Cl.
CPC ............. *G06F 1/28* (2013.01); *G06F 1/3206* (2013.01); *G06F 11/0757* (2013.01); *G06F 11/0796* (2013.01); *H03K 19/0016* (2013.01); *H03K 19/017581* (2013.01)

(58) Field of Classification Search
CPC ............ Y02B 60/1217; Y02B 60/1285; Y02B 60/34; Y02B 60/1278; Y02B 60/1282; G06F 1/3296; G06F 1/3209; G06F 1/3287; G06F 1/3203; G06F 1/3215; G06F 1/30; G06F 1/24; G06F 1/305; H04L 12/12
See application file for complete search history.

(56) References Cited

U.S. PATENT DOCUMENTS

| | | | |
|---|---|---|---|
| 9,746,904 B2 * | 8/2017 | Adewale | G06F 1/3234 |
| 2015/0067361 A1 * | 3/2015 | Rusu | G06F 1/3275 713/320 |
| 2015/0227190 A1 * | 8/2015 | Adewale | G06F 1/3215 713/323 |
| 2016/0139652 A1 * | 5/2016 | Huang | G06F 1/3287 713/323 |
| 2017/0160781 A1 * | 6/2017 | Piga | G06F 1/3206 |
| 2019/0079570 A1 * | 3/2019 | Lu | G06F 1/263 |

* cited by examiner

*Primary Examiner* — Zahid Choudhury
(74) *Attorney, Agent, or Firm* — Norton Rose Fulbright US LLP

(57) ABSTRACT

A fail-safe power limit (FSPL) can be applied to components that lose communication with a management module (MM) to determine a safe power level at which to operate. The FSPL may be computed by the management module (MM) for the information handling system and distributed to components in the information handling system. By computing a FSPL and transmitting the FSPL to the components, a larger amount of the available power can be used by the components. This allows the components to continue operating at performance levels closer to or equivalent to levels available when the management module (MM) is operating normally. The FSPL may be updated at set times and/or on a periodic schedule such that the FSPL used by the components when communication is lost with the management module (MM) reflects a recent operating state of the components.

20 Claims, 6 Drawing Sheets

FAIL-SAFE POWER LIMIT (FSPL) FOR FAIL-SAFE POWER MANAGEMENT IN INFORMATION HANDLING SYSTEMS

FIELD OF THE DISCLOSURE

The instant disclosure relates to information handling systems. More specifically, portions of this disclosure relate to managing power consumption in information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are powered by power supply units, with such supply units sometimes being shared by multiple components. Controllers are integrated within the information handling systems to control power consumption by the components to prevent overloading the power supply units. Conventionally, when these controllers are offline the components operate at a preprogrammed minimum power level through maximum throttling of the components to prevent overloading the power supply units. However, operating at such an extremely low level significantly reduces performance of the information handling system. For example, to reduce power consumption in accordance with the extreme low level may result in processors operating at extremely low clock rates. Under such conditions, the processing capacity and processing speed of the processors is significantly reduced, resulting in an undesirable user experience such as slow loading times.

Shortcomings mentioned here are only representative and are included simply to highlight that a need exists for improved electrical components, particularly for power management in information handling systems. Embodiments described herein address certain shortcomings but not necessarily each and every one described here or known in the art. Furthermore, embodiments described herein may present other benefits than, and be used in other applications than, those of the shortcomings described above.

SUMMARY

A fail-safe power limit (FSPL) can be applied to components that lose communication with a management module (MM) to determine a safe power level at which to operate. The FSPL may be computed by the management module (MM) for the information handling system and distributed to components in the information handling system. For some of the components, or all of the components, the FSPL value will be higher than the conventional preprogrammed minimum power level. Without the FSPL the conventional process reduces every component to a bare minimum in order to avoid overloading power supply units for the information handling system. This conventional technique often leaves some available power unused. By computing a FSPL and transmitting the FSPL to the components, a larger amount of the available power can be used by the components. This allows the components to continue operating at performance levels closer to or equivalent to levels available when the management module (MM) is operating normally. The FSPL may be updated at set times and/or on a periodic schedule such that the FSPL used by the components when communication is lost with the management module (MM) reflects a recent operating state of the components. For example, if workload shifts from one component to another component, then the FSPL values may be updated to allow the other component to operate at higher levels in the fail-safe condition. In some embodiments, the use of the FSPL value described herein may be advantageous applied to modular information handling systems having several power supply units that provide power to several processor nodes (sometimes referred to as sleds).

In some embodiments, an FSPL algorithm resides in a Power Manager (PM) firmware and starts with a pool of power to distribute to processor nodes that is identified as enough power to enable the desired node performance while also protecting the power supply units (PSUs) when there is not an active MM in the chassis. The initial pool of power could be alternatively distributed by, for example, dividing the pool equally among the compute nodes, dividing the pool based only on node power consumption, or dividing the pool based on user-defined node priority. In one embodiment, a three-step algorithm may be used for the FSPL algorithm. The first step is a power budget optimized version of dividing power equally to the nodes by distributing the pool of power to meet a NLB (Node Lower Boundary) value of the node. This step establishes a minimum performance level for all nodes. The second step is a power consumption optimized version of dividing power equally to the nodes, but this step builds on the first by distributing additional FSPL power to nodes based on historical power usage that are actively consuming power that is greater than the nodes' NLB power inventory. Nodes that are being used during normal run-time operation will retain as much performance as possible if there is a failure in the next 20 ms. This step enhances the first step, wherein the minimum performance inherent in the NLB value of nodes is increased to meet the real-time utilization of the nodes, which allows each nodes' FSPL power will result in higher performance of the chassis when there is not an active MM in the chassis. The third step is an optimized version of distributing power based only on a user-defined priority attribute. This step distributes any remaining FSPL power to high-priority and low-priority nodes in a predefined manner, such as at a 2:1 ratio, which allows the user to define which nodes will operate at higher performance levels if there is a failure.

In some embodiments, a power management algorithm exists in a complex logic device (CPLD) of the processor nodes to manage power consumption according to the FSPL value when fail-safe operation is triggered. Each node CPLD implements algorithms for defining FSPL mode and defining fail-safe mode entry and exit criteria. During a fail-safe mode the CPLD replaces the average node power limit (SPL_AVG or ASPL) with the Power Manager (PM)-calculated FSPL value and replaces the peak node power limit (SPL_PEAK) with a lower value. The FSPL value is optimized by the Power Manager (PM) to allow the nodes to have the highest performance in case of a failure. The CPLD passes the FSPL value calculated by the Power Manager (PM) to a node power manager in the processor node to control average power. The CPLD can itself control peak power by replacing the Power Manager (PM) calculated SPL_PEAK with a lower value that also is received by the node power manager.

The power management algorithm of the CPLD of a processor node can execute algorithms to determine when one or more management modules (MM) are unavailable to define an entry and exit into the fail-safe mode. For example, a 20 ms Power Manager (PM) heartbeat may be transmitted by the MMs to alert the nodes when the MMs are unavailable by the absence of a heartbeat signal. The heartbeat signal may be a signal that toggles between high and low at a predefined interval, such as 20 ms. Additional entry criteria may also be used, such as when there are redundant MMs in a modular information handling system to cover failover scenarios. For example, the CPLD can enter fail-safe mode if the heartbeat stops beating and/or if there is not an active MM with an asserted communications link. The asserted communication link may be, for example, a communication signal that is pulled high by an MM or a set of bits encoded on a communication bus that corresponding to the presence of an active MM. Such a multi-variable approach in the entry criteria for fail-safe mode can reduce timing corner cases that can cause the CPLD to consume FSPL values from the redundant MM before those values are initialized. When the redundant MM takes over from an active MM, it does not have sufficient knowledge of power consumption by the different nodes to accurately distribute power. Thus, in some embodiments, FSPL values may not be updated for a short period after a switchover of MMs.

For exiting the fail-safe mode, the CPLD can identify a return of the heartbeat. However, additional exit criteria can likewise be used to reduce any issues where the Power Manager (PM) algorithm could output non-ideal FSPL value(s) when the PM is released from reset. For example, exit criteria may require at least one active MM with an asserted communications link and a heartbeat signal with at least 5 consecutive beats. This reduces the likelihood of the CPLD consuming FSPL values before they are initialized in the responsible PM algorithm of the active MM.

In another embodiment, the Power Manager (PM) FSPL algorithm can reside in an iDRAC controller, FPGA, CPLD, or other processing unit within an information handling system. Additionally, the algorithms to enter/exit fail-safe mode as implemented in the CPLD could reside in the iDRAC controller, FPGA, Management Module (MM) or other processing unit within a system. In another embodiment, the Power Manager (PM) FSPL algorithm, and CPLD FSPL features, can be applied to an information handling system that does not have a multi-node modular chassis environment. In another embodiment, the Power Manager (PM) FSPL algorithm, and CPLD FSPL features, can enforce power limits directly by using the available power control mechanisms without the use of a node power manager.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

The Failsafe Power Limit (FSPL) limits the power consumption of components in an information handling system when there is not an active power manager for the information handling system. This limit protects the power supply units (PSUs) from excessive power output while enabling the system to operate at a nominal but safe power level. Each processor node receives an updated FSPL value defined by the active power manager firmware. A node can use throttling mechanisms to limit power consumption to the latest FSPL value in the event that the fail-safe mode is activated because there is not an active power manager available.

Figure 1:
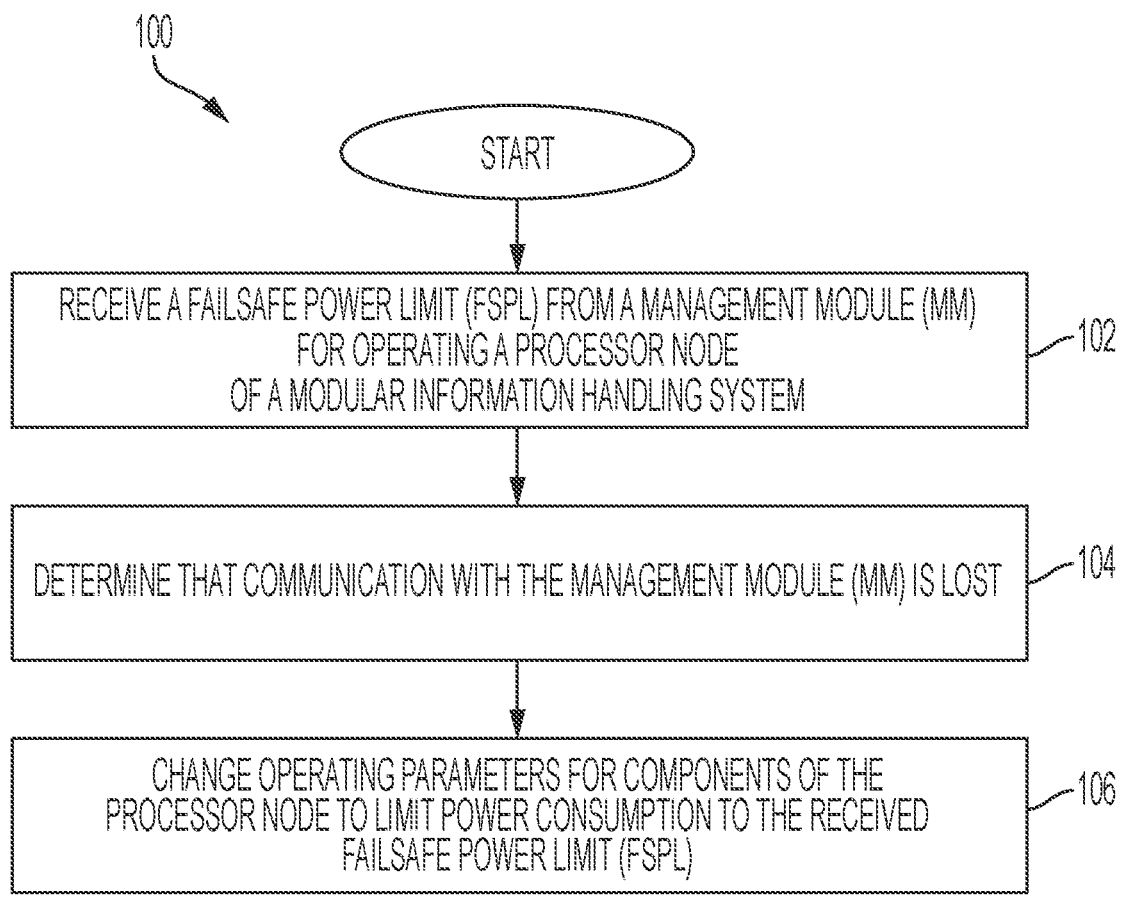
FIG. 1 is a flow chart illustrating a method for controlling power consumption in a fail-safe operational mode according to some embodiments of the disclosure.

FIG. 1 is a flow chart illustrating a method for controlling power consumption in a fail-safe operational mode according to some embodiments of the disclosure. A method 100 begins at block 102 with receiving a failsafe power limit (FSPL) from a management module (MM) for operating a processor node of a modular information handling system. At block 104 it is determined when communication with the management module (MM) is lost. After communication with the MM is lost, at block 106 operating parameters for components of the processor node are adjusted to limit power consumption to the FSPL received at block 102. The FSPL may be received repeatedly at block 102 such that when communication is lost at block 104 a FSPL implemented at block 106 corresponds to recent operating conditions for the modular information handling system.

Figure 2:
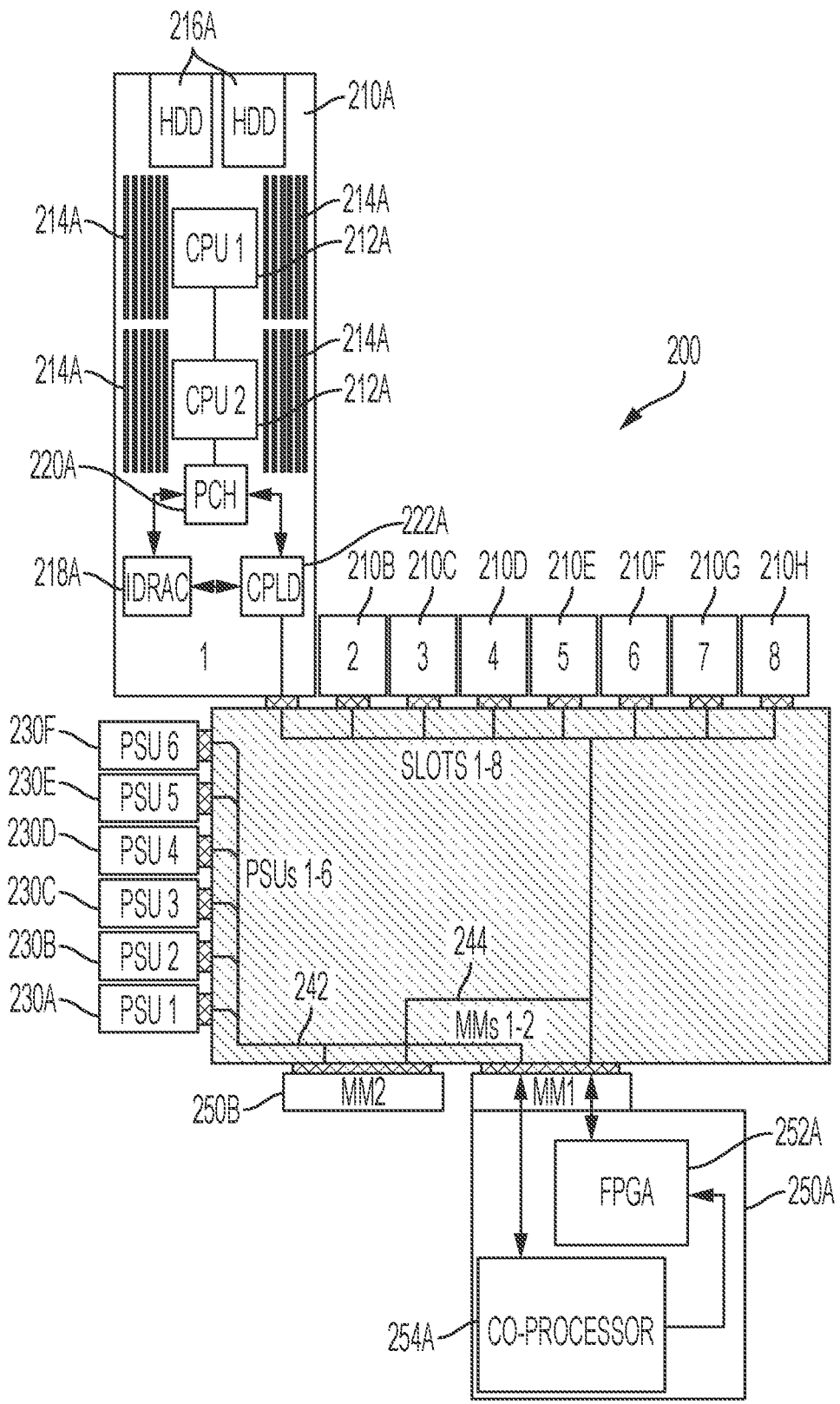
FIG. 2 is a block diagram illustrating a modular information handling system on which the fail-safe operation mode may be implemented according to some embodiments of the disclosure.

The FSPL limit described herein and the method described with respect to FIG. 1 may be implemented in a modular information handling system, such as the system shown in FIG. 2. FIG. 2 is a block diagram illustrating a modular information handling system on which the fail-safe operation mode may be implemented according to some embodiments of the disclosure. A modular information handling system 200 may include several processor nodes 210A-H. Each of the nodes 210A-H may include hardware components, some of which are configured with firmware algorithms related to implementing FSPL limits. For example, node 210A may include processors 212A and memory 214A coupled to the processors 212A. The node 210A may also include non-volatile storage 216A such as HDD or SDD units also coupled to the processors 212A. A platform controller hub (PCH) 220A can control components of the node 210A, such as to modify power consumption by the processors 212A.

A complex logic device (CPLD) 222A communicates with the FPGA 252A on the Management Module (MM) 250A and interfaces through a communication bus 244 to other components in the system 200. The Management Module (MM) 250A may include a field programmable gate array (FPGA) 252A or other logic device with a co-processor 254A configured to monitor power supply units (PSUs) 230A-F through bus 242. Co-processor 254A may execute power manager (PM) firmware to calculate FSPL values for each processor node 210A-H using a FSPL algorithm, to generate a PM heartbeat signal for transmission over the communication bus 244, and to transmit FSPL values and heartbeats to the processor nodes 210A-H. The CPLD 222A on the processor nodes 210A-H receives FSPL values and the heartbeat, enacts the FSPL mode when necessary, and enables the node manager firmware executing on PCH 220A to read the processor node power limits (SPLs). Platform Controller Hub (PCH) 220A executes node manager (NM) firmware to implement power control features and enforce power limits that are read from the CPLD 222A.

The Management Module (MM) 250A FPGA 252A is located between the co-processor 254A in the MM 250A, and the node CPLD 222A. The Management Module (MM) 250A may distribute the FSPL values from the Power Manager firmware to the nodes 210A-H. The FPGA 252A receives the FSPL values for each node 210A-H from the Power Manager firmware on the co-processor 254A every 20 ms, and populates a set of registers to be sent to the CPLD of each processor node in the modular information handling system. The communications bus 244 transmits the payloads from the FPGA 252A to the CPLD 222A approximately every 25 us.

The CPLD 222A is in-between the PCH 220A and the FPGA 252A. The CPLD 222A receives the FSPLs calculated by the Power Manager (PM) from the FPGA 252A and delivers them to the node manager which resides inside the PCH 220A where the FSPLs can be implemented using power control mechanisms for the processors 212A. The CPLD 222A can also identify if there is an active MM 250A in the information handling system. The CPLD 222A switches to fail-safe mode if there is not an active MM or healthy Power Manager (PM) in the system. Fail-safe mode replaces the conventional run-time average node power limit with the lower FSPL limit. The node manager which resides inside the PCH 220A enforces the FSPL limit via power limiting mechanisms, such as throttling of the processors 212A.

The CPLD 222A receives data from the communications bus 244 about every 25 us which include: node average power limit (SPL_AVG), node peak power limit (SPL_PEAK), Failsafe Power Limit (FSPL), the Power Manager, which is running inside Co-Processor 254A, 20 ms heartbeat (PM_COPROC_HB), and EC1_LINK_ACTIVE and EC2_LINK_ACTIVE, which define which of the two Management Modules (MMs) 250A and 250B is active and updating the communication bus 244 payloads. The node manager which resides inside the PCH 220A reads the SPL_AVG, and SPL_PEAK, values every 10 ms, and uses power control mechanisms to enforce the sled average and peak power limits.

If there is not an active MM 250A or healthy Power Manager (PM) in the system, the CPLD 222A enters a fail-safe mode. In fail-safe mode, the normal run-time average power consumption value that is sent to the node power manager on PCH 220A is overwritten with the lower Failsafe Power Limit (FSPL) and the normal run-time peak power consumption is replaced with a lower value to limit the node peak power capabilities. Setting the node manager to control average power to the FSPL limit, and limiting the peak power, enables the system to meet the customer needs of power and performance while also protecting the power supply units (PSUs) 230A-F from excessive power output in this failure condition.

The node power manager is firmware that runs on the PCH 220A, which consumes of the FSPL values for the node. The node power manager polls the CPLD 222A for Average Node Power Limit (SPL_AVG) and Peak Power Limit (SPL_PEAK) values. In some embodiments, this occurs approximately every 10 ms during normal run-time conditions after BIOS POST. The node power manager hardware protection policy limit may be set to the SPL_AVG value, and the SPL_PEAK power limits may be used to set CPU ICC_MAX values. The CPUs 212A can be controlled in accordance with the values to limit the power consumption of the node 210A such that the SPL_AVG and SPL_PEAK power limits are not exceeded.

Figure 3:
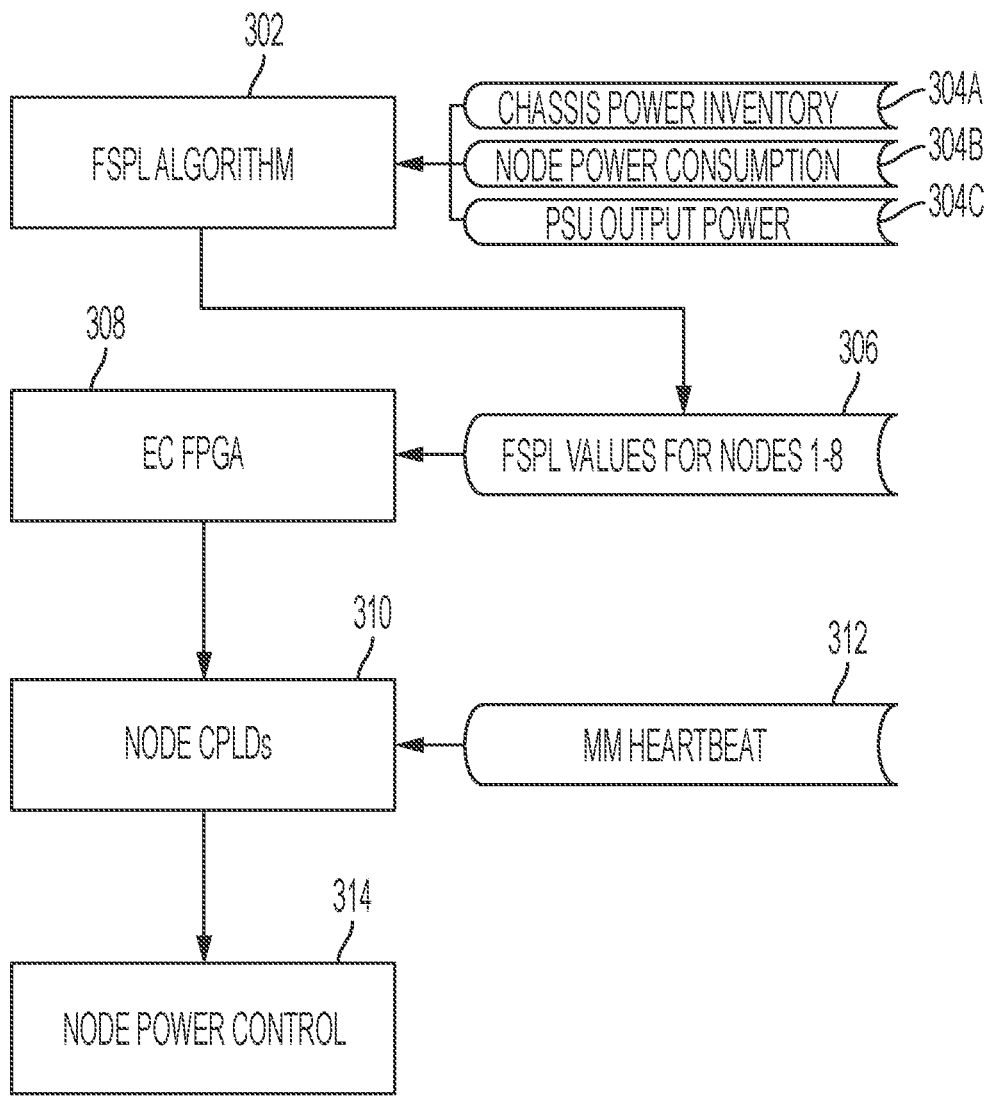
FIG. 3 is a flow chart illustrating a method of controlling power in a modular information handling system according to some embodiments of the disclosure.

FIG. 3 is a flow chart illustrating a method of controlling power in a modular information handling system according to some embodiments of the disclosure. A Failsafe Power Limit (FSPL) algorithm 302 is executed to limit the power consumption of processor nodes when there is not an active MM in a system in order to protect power supply units (PSUs) from tripping. The FSPL algorithm 302 assigns FSPL values 306 to processor nodes based on a power inventory 304A, a historical power consumption 304B, and PSU output power 304C. The values are distributed at block 308 by the Management Module (MM) FPGA to the node CPLDs and received by the CPLDs at block 310. The CPLDs receive a heartbeat from the Management Module (MM) at block 312 and execute an algorithm to control processor node power at block 314.

Power Manager (PM) firmware executes on the Management Module (MM) Co-Processor and implements the Fail-safe Power Limit (FSPL) algorithm 302 that calculates the FSPL value for each processor node. In some embodiments, the Power Manager has a 20 ms run-time loop where the FSPL value is calculated based on the values of some or all of attributes 304A-C. For example, FSPL algorithm 302 inputs can include minimum number of PSUs to meet power demand, number of active PSUs, total output power (e.g., available power) from all active PSUs, capacity of PSUs), sled instantaneous power, processor node priority, processor node lower boundary, and/or infrastructure power (e.g., the difference between the total active PSU output and instantaneous power consumed by all processor nodes). The FSPL values for nodes are provided to the MM EC FPGA at block 308, which distributes the values to node CPLDs at block 310. The CPLDs receive MM EC heartbeats at block 312, and perform node power control at block 314 based on the FSPL value and the heartbeat. One example algorithm for that control is shown in FIG. 5. An example algorithm for the FSPL algorithm 302 is shown in FIG. 4.

Figure 4:
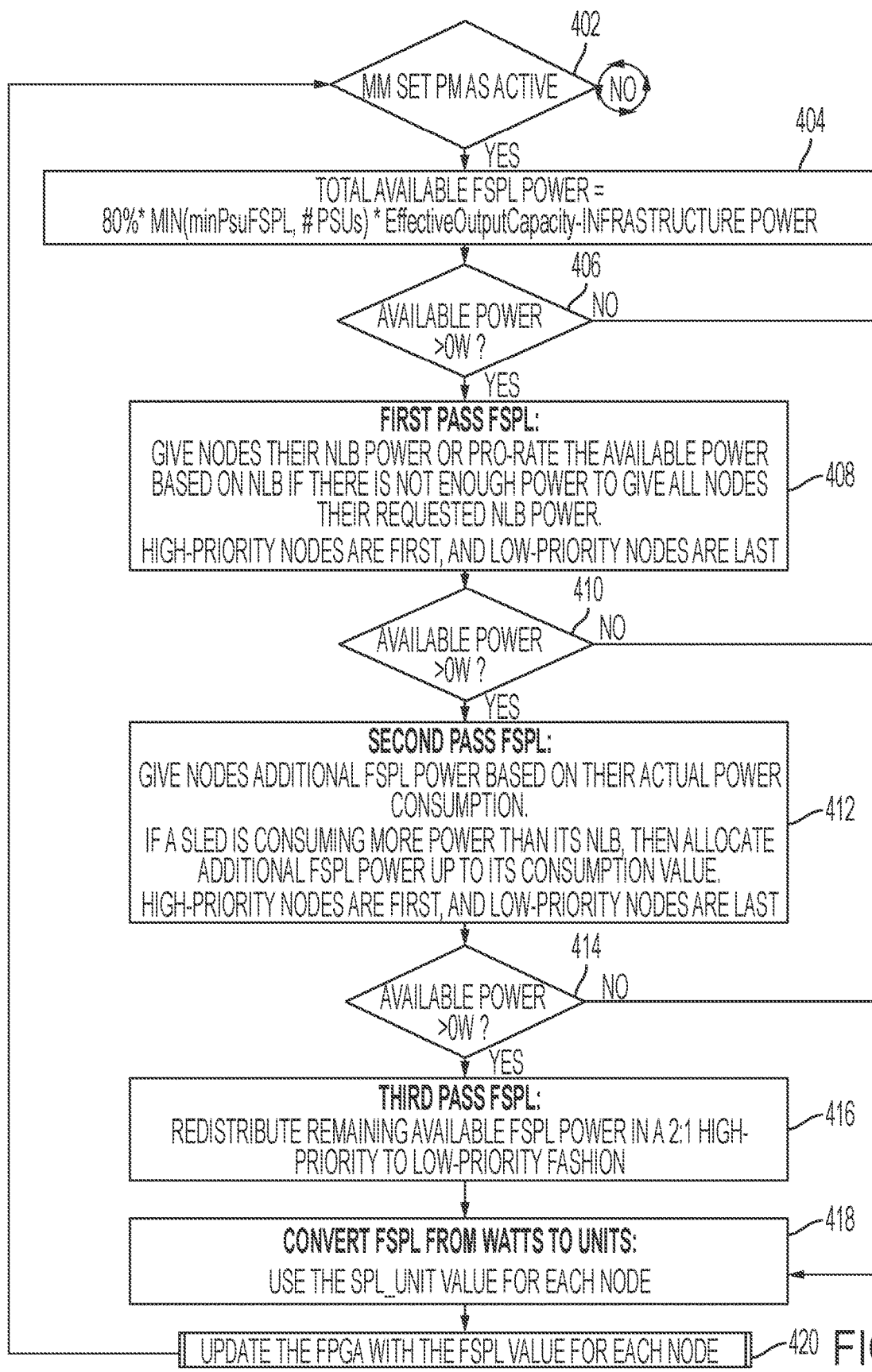
FIG. 4 is a flow chart illustrating an example method for assigning fail-safe power limits (FSPLs) to nodes of a modular information handling system according to some embodiments of the disclosure.
Figure 5:
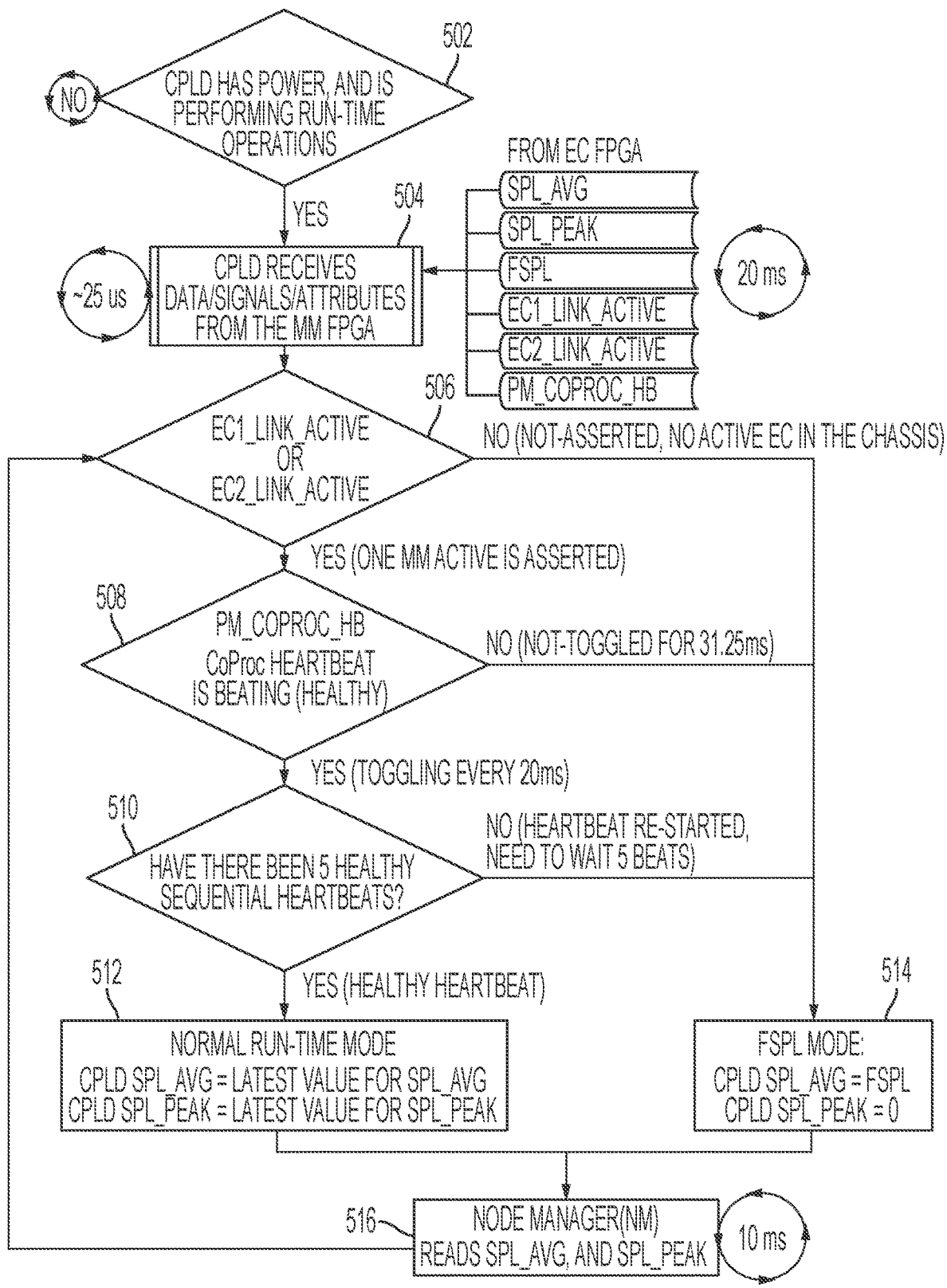
FIG. 5 is a flow chart illustrating an example method for controlling a node of a modular information handling system using a fail-safe power level (FSPL) according to some embodiments of the disclosure.

FIG. 4 is a flow chart illustrating an example method for assigning fail-safe power limits (FSPLs) to nodes of a modular information handling system according to some embodiments of the disclosure. In this embodiment, the Power Manager fail-safe algorithm operates in a three-step process on an MM EC co-processor that calculates the FSPL values for each node and converts them to an 8-bit value that is transmitted over a communications bus to the enclosure controller FPGA for distribution to the processor nodes.

First, at block 404, the total available FSPL power to distribute is calculated. If the available power is greater than 0 Watts at block 406, the process continues to the first pass at block 408. If not, the process skips to block 418. In the first pass at block 408, FSPL power is allocated to each node based on their node lower boundary (NLB) value. If the available power is still greater than 0 Watts at block 410, the process continues to the second pass at block 412. If not, the process skips to block 418. In the second pass at block 412, additional FSPL power is allocated for each node that is consuming more than their NLB based on historical power usage. If the available power is still greater than 0 Watts at block 414, the process continues to the third pass at block 416. If not, the process skips to block 418. In the third pass at block 416, remaining power is distributed into the FSPL values for the nodes at a predefined ratio, such as 2:1 ratio, based on a priority level of each node. In one embodiment, high-priority nodes receive twice as much allotment as low-priority nodes. At block 418, the FSPL value is converted to a unit-less 8-bit number using the SPL_UNIT value. However, other means for communicating the FSPL value to processor nodes may be used. At block 420, the FSPL value for each node is transmitted to the MM EC FPGA to be consumed by the node CPLDs.

FIG. 5 is a flow chart illustrating an example method for controlling a node of a modular information handling system using a fail-safe power level (FSPL) according to some embodiments of the disclosure. Fail-safe mode may be entered and exited when the MM starts a failover process and the MM and Power Manager resume functionality. At block 502, the CPLD operates when it has power and is performing run-time operations. At block 504, the CPLD receives signals from the EC FPGA, such as SPL_AVG, SPL_PEAK, FSPL, EC1_LINK_ACTIVE, EC2_LINK_ACTIVE, and/or a PM_COPROC_HB heartbeat value. At block 506, the CPLD determines if either of the communications links to the ECs are asserted by checking the EC1_LINK_ACTIVE and EC2_LINK_ACTIVE signals. If not, fail-safe mode is entered at block 514 with the average power limit set to the FSPL value and the peak power limit set to zero. If one of the EC communications links is active at block 506, the process continues to block 508. At block 508, the CPLD checks for a heartbeat signal. If the heartbeat is not toggled for a predetermined period of time, then fail-safe mode is entered at block 514. If the heartbeat signal is toggling then the process continues to block 510. At block 510, the CPLD determines if there have been a predetermined number of health heartbeats, such as five heartbeats. If not, the fail-safe mode is entered at block 514. If yes, the heartbeat is indicated as healthy and the normal run-time mode is entered or maintained at block 512, in which the average power limit is set to the average value received from the MM EC and the peak power limit is set to the peak value received from the MM EC. At block 516, a node power manager firmware receives the peak power limit and the average value determined at block 512 or block 514, and that node power manager implements throttling and/or other functions to enforce the average and peak power limits. The process of FIG. 5 checks for a minimum number of heartbeat values to reduce the likelihood that the CPLD will read power values from a newly active MM that does not yet have valid data.

Figure 6:
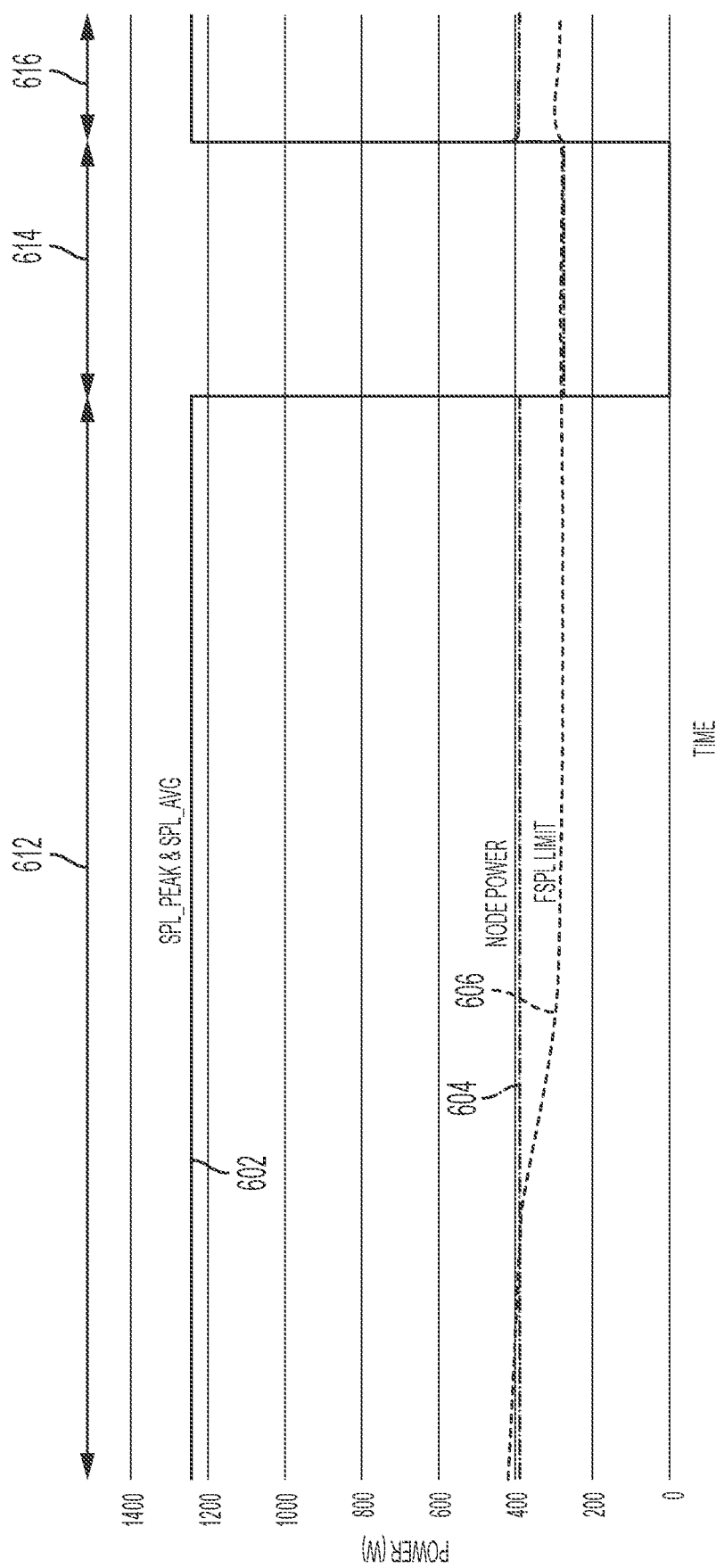
FIG. 6 is a graph illustrating power levels of a processor node in a modular information handling system before, during, and after a fail-safe mode is executed according to some embodiments of the disclosure.

FIG. 6 is a graph illustrating power levels of a processor node in a modular information handling system before, during, and after a fail-safe mode is executed according to some embodiments of the disclosure. A line 602 illustrates the peak and average power limits assigned by the CPLD. A line 604 illustrates processor node power consumption. A line 606 illustrates the FSPL value received from the MM. Time 612 illustrates normal operation. Time 614 illustrates a fail-safe mode of operation. During time 614, the peak power level is set to zero and the average power level is set to the FSPL limit of line 606, which reduces the power consumption shown in line 604 to the FSPL limit. After the MM EC returns to active status, the CPLD returns to normal operation in time 616 by implementing average and peak power limits received form the MM EC.

The schematic flow chart diagrams of FIG. 1, FIG. 3, FIG. 4, and FIG. 5 are generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The operations described above as performed by a controller may be performed by any circuit configured to perform the described operations. Such a circuit may be an integrated circuit (IC) constructed on a semiconductor substrate and include logic circuitry, such as transistors configured as logic gates, and memory circuitry, such as transistors and capacitors configured as dynamic random-access memory (DRAM), electronically programmable read-only memory (EPROM), or other memory devices. The logic circuitry may be configured through hard-wire connections or through programming by instructions contained in firmware. Further, the logic circuitry may be configured as a general-purpose processor capable of executing instructions contained in software. If implemented in firmware and/or software, functions described above may be stored as one or more instructions or code on a computer-readable medium. Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc include compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. For example, although processors are described throughout the detailed description, aspects of the invention may be implemented on different kinds of processors, such as graphics processing units (GPUs), central processing units (CPUs), and digital signal processors (DSPs). As another example, although processing of certain kinds of data may be described in example embodiments, other kinds or types of data may be processed through the methods and devices described above. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

What is claimed is:

1. A method, comprising:
   receiving, at a processor node of a modular information handling system, a failsafe power limit (FSPL);
   determining, by the processor node of the modular information handling system, that communication with a management module (MM) is lost; and
   changing, by the processor node of the modular information handling system, operating parameters for components of the processor node to limit power consumption of the processor node to the received failsafe power limit (FSPL) after determining that communication with the management module (MM) is lost.

2. The method of claim 1, wherein the step of determining that communication with a management module (MM) is lost by:
   determining that a link status signal corresponding to the management module (MM) is de-asserted; and
   determining that a heartbeat signal corresponding to the management module (MM) is not received within a predetermined period of time.

3. The method of claim 1, further comprising:
   determining, by the processor node of the modular information handling system, that communication with the management module (MM) is re-established; and
   waiting, by the processor node of the modular information handling system, a predetermined period of time after determining communication is re-established;

receiving, by the processor node of the modular information handling system, an operating power limit different from the failsafe power limit (FSPL) from the management module (MM) after the predetermined period of time for waiting; and changing, by the processor node of the modular information handling system, the operating parameters for the components of the processor node in accordance with the operational power limit received from the management module (MM).

4. The method of claim 1, further comprising:

determining, by the processor node of the modular information handling system, that communication with a second management module (MM) is lost, wherein the step of changing, by the processor node of the modular information handling system, operating parameters for components of the processor node to limit power consumption of the processor node to the received failsafe power limit (FSPL) is performed after determining that communication with the management module (MM) is lost and after determining that communication with the second management module (MM) is lost.

5. The method of claim 1, further comprising calculating, by the management module (MM) the failsafe power limit (FSPL) based at least on an available power level, historical power usage by the processor node, historical power usage by a second processor node, a first priority for the processor node, and a second priority for the second processor node.

6. The method of claim 5, wherein the step of calculating the failsafe power limit (FSPL) comprises:

determining, by the management module (MM), the available power level for the modular information handling system;

assigning, by the management module (MM), a first power allotment to the processor node and a second power allotment to the second processor node based on a first node lower boundary for the processor node and a second node lower boundary for the second processor node, respectively;

increasing, by the management module (MM), the first power allotment and the second power allotment based on the historical power usage by the processor node and the historical power usage by the second processor node, respectively;

increasing, by the management module (MM), the first power allotment and the second power allotment based on the first priority for the processor node and the second priority for the second processor node, respectively, wherein the first power allotment is the failsafe power limit (FSPL); and transmitting, by the management module (MM), the failsafe power limit (FSPL) to the processor node.

7. The method of claim 6, further comprising:

determining an updated failsafe power limit (FSPL) by repeating the steps of assigning the first power allotment, increasing the first power allotment based on the historical power usage by the processor node, and increasing the first power allotment based on the first priority for the processor node; and transmitting, by the management module (MM), the updated failsafe power limit (FSPL) to the processor node.

8. A computer program product, comprising:

a non-tangible computer readable medium comprising code to perform steps comprising:

receiving, at a processor node of a modular information handling system, a failsafe power limit (FSPL);

determining, by the processor node of the modular information handling system, that communication with a management module (MM) is lost; and changing, by the processor node of the modular information handling system, operating parameters for components of the processor node to limit power consumption of the processor node to the received failsafe power limit (FSPL) after determining that communication with the management module (MM) is lost.

9. The computer program product of claim 8, wherein the step of determining that communication with a management module (MM) is lost by:

determining that a link status signal corresponding to the management module (MM) is de-asserted; and determining that a heartbeat signal corresponding to the management module (MM) is not received within a predetermined period of time.

10. The computer program product of claim 8, wherein the medium further comprises code to perform steps comprising:

determining, by the processor node of the modular information handling system, that communication with the management module (MM) is re-established; and waiting, by the processor node of the modular information handling system, a predetermined period of time after determining communication is re-established;

receiving, by the processor node of the modular information handling system, an operating power limit different from the failsafe power limit (FSPL) from the management module (MM) after the predetermined period of time for waiting; and changing, by the processor node of the modular information handling system, the operating parameters for the components of the processor node in accordance with the operational power limit received from the management module (MM).

11. The computer program product of claim 8, wherein the medium further comprises code to perform steps comprising:

determining, by the processor node of the modular information handling system, that communication with a second management module (MM) is lost, wherein the step of changing, by the processor node of the modular information handling system, operating parameters for components of the processor node to limit power consumption of the processor node to the received failsafe power limit (FSPL) is performed after determining that communication with the management module (MM) is lost and after determining that communication with the second management module (MM) is lost.

12. The computer program product of claim 8, wherein the medium further comprises code to perform steps comprising calculating, by the management module (MM) the failsafe power limit (FSPL) based at least on an available power level, historical power usage by the processor node, historical power usage by a second processor node, a first priority for the processor node, and a second priority for the second processor node.

13. The computer program product of claim 12, wherein the step of calculating the failsafe power limit (FSPL) comprises:
- determining, by the management module (MM), the available power level for the modular information handling system;
- assigning, by the management module (MM), a first power allotment to the processor node and a second power allotment to the second processor node based on a first node lower boundary for the processor node and a second node lower boundary for the second processor node, respectively;
- increasing, by the management module (MM), the first power allotment and the second power allotment based on the historical power usage by the processor node and the historical power usage by the second processor node, respectively;
- increasing, by the management module (MM), the first power allotment and the second power allotment based on the first priority for the processor node and the second priority for the second processor node, respectively, wherein the first power allotment is the failsafe power limit (FSPL); and
- transmitting, by the management module (MM), the failsafe power limit (FSPL) to the processor node.

14. An information handling system, comprising:
- a first processor node, comprising:
  - a processor;
  - a memory coupled to the processor; and
  - programmable controller logic coupled to the processor and configured to control at least one operating parameter of the processor in accordance with a power limit for the processor node; and
- a management module (MM), comprising:
  - a programmable controller logic configured to determine a power limit for the processor node and a second processor node,
  - wherein the programmable controller logic is configured to perform steps comprising:
    - receiving, at a processor node of a modular information handling system, a failsafe power limit (FSPL);
    - determining, by the processor node of the modular information handling system, that communication with a management module (MM) is lost; and
    - changing, by the processor node of the modular information handling system, operating parameters for components of the processor node to limit power consumption of the processor node to the received failsafe power limit (FSPL) after determining that communication with the management module (MM) is lost.

15. The information handling system of claim 14, wherein the step of determining that communication with a management module (MM) is lost by:
- determining that a link status signal corresponding to the management module (MM) is de-asserted; and
- determining that a heartbeat signal corresponding to the management module (MM) is not received within a predetermined period of time.

16. The information handling system of claim 14, wherein the programmable controller logic is further configured to perform steps comprising:
- determining, by the processor node of the modular information handling system, that communication with the management module (MM) is re-established; and
- waiting, by the processor node of the modular information handling system, a predetermined period of time after determining communication is re-established;
- receiving, by the processor node of the modular information handling system, an operating power limit different from the failsafe power limit (FSPL) from the management module (MM) after the predetermined period of time for waiting; and
- changing, by the processor node of the modular information handling system, the operating parameters for the components of the processor node in accordance with the operational power limit received from the management module (MM).

17. The information handling system of claim 14, wherein the programmable controller logic is further configured to perform steps comprising:
- determining, by the processor node of the modular information handling system, that communication with a second management module (MM) is lost,
- wherein the step of changing, by the processor node of the modular information handling system, operating parameters for components of the processor node to limit power consumption of the processor node to the received failsafe power limit (FSPL) is performed after determining that communication with the management module (MM) is lost and after determining that communication with the second management module (MM) is lost.

18. The information handling system of claim 17, wherein the programmable controller logic is further configured to perform steps comprising calculating, by the management module (MM) the failsafe power limit (FSPL) based at least on an available power level, historical power usage by the processor node, historical power usage by a second processor node, a first priority for the processor node, and a second priority for the second processor node.

19. The information handling system of claim 18, wherein the step of calculating the failsafe power limit (FSPL) comprises:
- determining, by the management module (MM), the available power level for the modular information handling system;
- assigning, by the management module (MM), a first power allotment to the processor node and a second power allotment to the second processor node based on a first node lower boundary for the processor node and a second node lower boundary for the second processor node, respectively;
- increasing, by the management module (MM), the first power allotment and the second power allotment based on the historical power usage by the processor node and the historical power usage by the second processor node, respectively;
- increasing, by the management module (MM), the first power allotment and the second power allotment based on the first priority for the processor node and the second priority for the second processor node, respectively, wherein the first power allotment is the failsafe power limit (FSPL); and
- transmitting, by the management module (MM), the failsafe power limit (FSPL) to the processor node.

20. The information handling system of claim 19, wherein the programmable controller logic is further configured to perform steps comprising:
- determining an updated failsafe power limit (FSPL) by repeating the steps of assigning the first power allotment, increasing the first power allotment based on the historical power usage by the processor node, and increasing the first power allotment based on the first priority for the processor node; and transmitting, by the management module (MM), the updated failsafe power limit (FSPL) to the processor node.

\* \* \* \* \*